United States Patent
Yang et al.

(10) Patent No.: US 11,929,418 B2
(45) Date of Patent: *Mar. 12, 2024

(54) METAL GATE STRUCTURE AND METHOD OF FABRICATING THE SAME

(71) Applicant: UNITED MICROELECTRONICS CORP., Hsin-Chu (TW)

(72) Inventors: Jie-Ning Yang, Pingtung County (TW); Wen-Tsung Chang, Tainan (TW); Po-Wen Su, Kaohsiung (TW); Kuan-Ying Lai, Chiayi (TW); Bo-Yu Su, Tainan (TW); Chun-Mao Chiou, Chiayi County (TW); Yao-Jhan Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 72 days.

This patent is subject to a terminal disclaimer.

(21) Appl. No.: 17/524,723

(22) Filed: Nov. 11, 2021

(65) Prior Publication Data
US 2022/0077300 A1    Mar. 10, 2022

Related U.S. Application Data

(63) Continuation of application No. 16/205,174, filed on Nov. 29, 2018, now Pat. No. 11,205,705.

(30) Foreign Application Priority Data

Nov. 6, 2018  (TW) .................. 107139307

(51) Int. Cl.
*H01L 29/423* (2006.01)
*H01L 21/768* (2006.01)
(Continued)

(52) U.S. Cl.
CPC .... *H01L 29/4966* (2013.01); *H01L 21/76838* (2013.01); *H01L 21/76897* (2013.01);
(Continued)

(58) Field of Classification Search
CPC ....... H01L 21/823842; H01L 29/66545; H01L 21/823821; H01L 27/0924;
(Continued)

(56) References Cited

U.S. PATENT DOCUMENTS

9,865,697 B1 * 1/2018 Hsueh ............... H01L 29/66545
2011/0198699 A1 8/2011 Hung
(Continued)

*Primary Examiner* — Mark W Tornow
*Assistant Examiner* — Priya M Rampersaud
(74) *Attorney, Agent, or Firm* — Winston Hsu (57) ABSTRACT

A gate structure includes a substrate divided into an N-type transistor region and a P-type transistor region. An interlayer dielectric covers the substrate. A first trench is embedded in the interlayer dielectric within the N-type transistor region. A first gate electrode having a bullet-shaped profile is disposed in the first trench. A gate dielectric contacts the first trench. An N-type work function layer is disposed between the gate dielectric layer and the first gate electrode. A second trench is embedded in the interlayer dielectric within the P-type transistor region. A second gate electrode having a first mushroom-shaped profile is disposed in the second trench. The gate dielectric layer contacts the second trench. The N-type work function layer is disposed between the gate dielectric layer and the second gate electrode. A first P-type work function layer is disposed between the gate dielectric layer and the N-type work function layer.

17 Claims, 7 Drawing Sheets

(51) Int. Cl.
*H01L 21/8234* (2006.01)
*H01L 29/417* (2006.01)
*H01L 29/49* (2006.01)
*H01L 29/66* (2006.01)

(52) U.S. Cl.
CPC .............. *H01L 21/823437* (2013.01); *H01L 29/41783* (2013.01); *H01L 29/42376* (2013.01); *H01L 29/66545* (2013.01)

(58) Field of Classification Search
CPC ........... H01L 29/42376; H01L 29/4238; H01L 29/4966; H01L 21/76802; H01L 21/76807; H01L 21/76829; H01L 21/76834; H01L 21/76877; H01L 21/76885; H01L 23/485; H01L 21/76831; H01L 21/76865; H01L 23/53295; H01L 21/28088; H01L 29/6656; H01L 29/0649; H01L 29/0847
See application file for complete search history.

(56) References Cited

U.S. PATENT DOCUMENTS

| | | |
|---|---|---|
| 2012/0313178 A1 | 12/2012 | Liao |
| 2012/0322246 A1 | 12/2012 | Wang |
| 2013/0099307 A1* | 4/2013 | Tseng ................ H01L 29/66545 438/424 |
| 2013/0334690 A1 | 12/2013 | Tsai |
| 2014/0346616 A1 | 11/2014 | Tsai |
| 2014/0363960 A1 | 12/2014 | Kim |
| 2015/0187763 A1* | 7/2015 | Kim ..................... H01L 29/518 257/368 |
| 2016/0104704 A1* | 4/2016 | Fang ................... H01L 29/4238 438/275 |
| 2017/0012107 A1 | 1/2017 | Park |
| 2017/0077257 A1 | 3/2017 | Hung |
| 2017/0213826 A1* | 7/2017 | Kim .................... H01L 21/82345 |
| 2017/0243869 A1* | 8/2017 | Chang .................. H01L 29/517 |
| 2019/0157165 A1 | 5/2019 | Kim |
| 2019/0189613 A1 | 6/2019 | Ha |
| 2021/0057282 A1* | 2/2021 | Chen .................. H01L 21/31111 |

* cited by examiner

METAL GATE STRUCTURE AND METHOD OF FABRICATING THE SAME

CROSS REFERENCE TO RELATED APPLICATIONS

This patent application is a continuation application of and claims priority to U.S. patent application Ser. No. 16/205,174, filed on Nov. 29, 2018, and entitled "METAL GATE STRUCTURE AND METHOD OF FABRICATING THE SAME" the entire contents of which are incorporated herein by reference.

BACKGROUND OF THE INVENTION

1. Field of the Invention

The present invention relates to a gate structure, and more particularly to a metal gate structure and a method of fabricating the same.

2. Description of the Prior Art

In the integrated circuit industry, MOS transistors have typically been formed utilizing polysilicon gate electrodes. Polysilicon material has been preferred for use as a MOS gate electrode due to its thermal resistive properties. However, polysilicon gate electrodes have certain disadvantages. For example, polysilicon gate electrodes are formed from semiconductor materials that suffer from higher resistivity than most metal materials. Therefore, polysilicon gate electrodes may operate at much slower speeds than gates made of metallic materials.

Thus, metal gates are developed to replace the conventional polysilicon gate to be the control electrode. However, there is always a continuing need in the semiconductor processing art to develop semiconductor device rendering superior performance and reliability such as reducing the sheet resistance of a metal gate to increase the performance.

SUMMARY OF THE INVENTION

Therefore, it is one objective of the present invention to provide a novel structure and fabricating method of a metal gate structure.

According to a preferred embodiment of the present invention, a gate structure includes a substrate, a first N-type gate structure and a first P-type gate structure. The substrate is divided into an N-type transistor region and a P-type transistor region. An interlayer dielectric covers the substrate. A first N-type gate structure is disposed within the N-type transistor region. The first N-type gate structure includes a first trench embedded in the interlayer dielectric, a first gate electrode disposed in the first trench, wherein the first gate electrode has a bullet-shaped profile under a cross-sectional view, a gate dielectric layer contacting the first trench, an N-type work function layer disposed between the gate dielectric layer and the first gate electrode. The first P-type gate structure is disposed within the P-type transistor region, wherein the first P-type gate structure includes a second trench embedded in the interlayer dielectric. A second gate electrode is disposed in the second trench. The second gate electrode has a first mushroom-shaped profile under a cross-sectional view. The gate dielectric layer contacts the second trench. The N-type work function layer is disposed between the gate dielectric layer and the second gate electrode and a first P-type work function layer are disposed between the gate dielectric layer and the N-type work function layer.

According to another preferred embodiment of the present invention, a fabricating method of a gate structure includes providing a substrate divided into a N-type transistor region and a P-type transistor region, an interlayer dielectric covering the N-type transistor region and the P-type transistor region, a first trench disposed in the interlayer dielectric within the N-type transistor region, a second trench disposed in the interlayer dielectric within the P-type transistor region, and a gate dielectric layer covering the first trench and the second trench. Later, a P-type work function layer is formed to cover the second trench. Next, a first removing process is performed to remove the P-type work function layer at an upper portion of the second trench. After performing the first removing process, an N-type work function layer is formed to cover the first trench and the second trench. A metal layer is formed on the N-type work function layer on the first trench and the second trench. Subsequently, a second removing process is performed to remove part of the gate dielectric layer, part of the metal layer, part of the N-type work function layer to make a topmost surface of the gate dielectric layer, a topmost surface of the metal layer and a topmost surface of the N-type work function layer lower than the top surface of the interlayer dielectric. Finally, a third removing process is performed to remove part of the N-type work function layer to make the metal layer protrude out of the N-type work function layer, and make the metal layer in the first trench become a bullet-shaped profile under a cross-sectional view. The metal layer in the second trench becomes a mushroom-shaped profile under a cross-sectional view.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 depict a fabricating method of a gate structure according to a preferred embodiment of the present invention, wherein:

DETAILED DESCRIPTION

Figure 1:
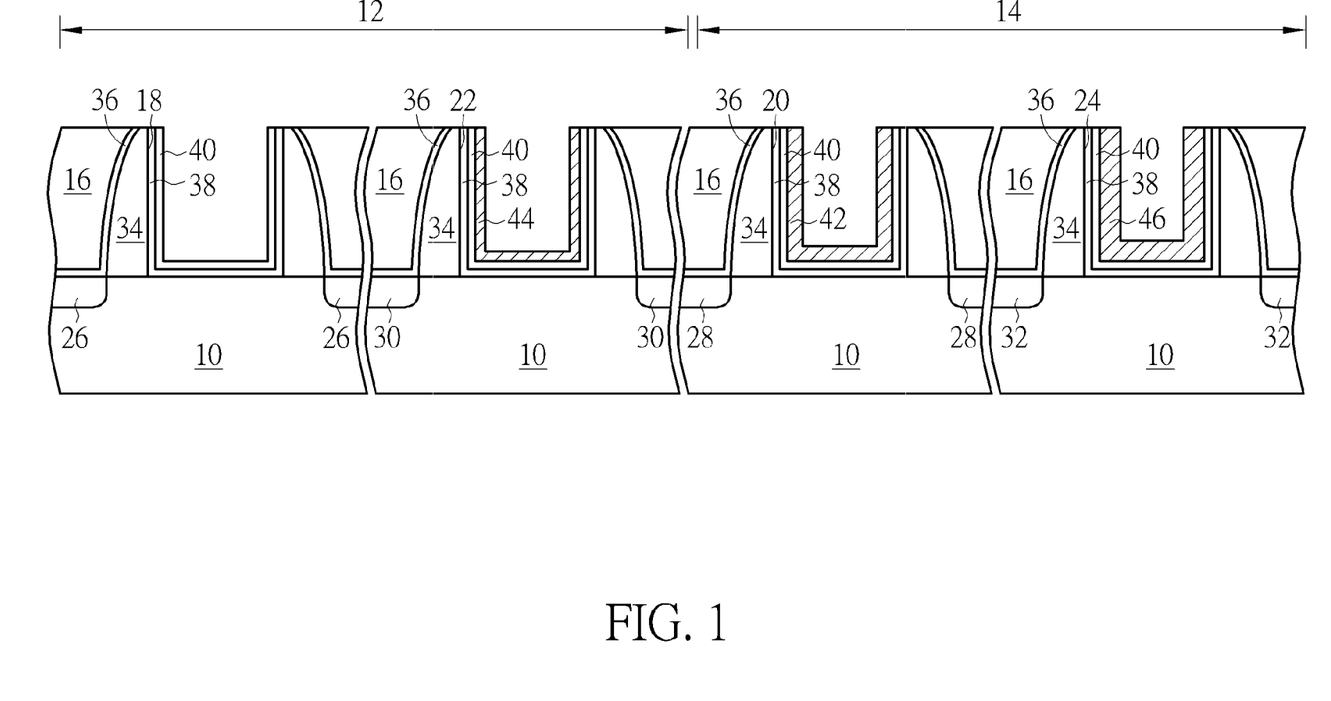
FIG. 1 depicts a substrate with trenches in an interlayer dielectric.

FIG. 1 to FIG. 6 depict a fabricating method of a gate structure according to a preferred embodiment of the present invention. As shown in FIG. 1. A substrate 10 is provided. The substrate 10 is divided into an N-type transistor region 12 and a P-type transistor region 14. The substrate 10 can be a silicon substrate, a silicon-containing substrate or a silicon-on-insulator substrate. Numerous shallow trench isolations (not shown) are embedded in the substrate 10 to provide electrical isolation between different devices. The substrate 10 may be a fin structure or a planar wafer. An interlayer dielectric 16 covers the substrate 10. The first trench 18 and a third trench 22 are disposed in the interlayer dielectric 16 within the N-type transistor region 12. A second trench 20 and a fourth trench 24 are disposed in the interlayer dielectric 16 within the P-type transistor region 14. Source/drain doped regions 26/28/30/32 are respectively disposed at two sides of the first trench 18, two sides of the second trench 20, two sides of the third trench 22 and two sides of the fourth trench 24. According to a preferred embodiment of the present invention, the shape and the size of the first trench 18, the second trench 20, the third trench 22 and the fourth trench 24 are the same. But, not limited to this circumstance, the shape and the size of the first trench 18, the second trench 20, the third trench 22 and the fourth trench 24 can be altered based on different requirements. Moreover, a spacer 34 respectively surrounds an outer wall of the first trench 18, an outer wall of the second trench 20, an outer wall of the third trench 22 and an outer wall of the fourth trench 24. An etching stop layer 36 covers the spacer 34 on the first trench 18, the second trench 20, the third trench 22 and the fourth trench 24. The spacer 34 and the etching stop layer 36 may be silicon nitride or silicon oxynitride.

Next, a gate dielectric layer 38 is formed to conformally cover and contact the first trench 18, the second trench 20, the third trench 22 and the fourth trench 24. The gate dielectric layer 38 includes SiN, SiON, $HfO_2$, HfSiO, HfSiON, $Al_2O_3$, $La_2O_3$, $LaAlO_3$, $Ta_2O_5$, $ZrO_2$, $ZrSiO_4$ or $HfZrO_3$.

Later, a barrier 40 is formed to conformally cover the gate dielectric layer 38, the first trench 18, the second trench 20, the third trench 22 and the fourth trench 24. The barrier 40 may include Ti, Ta, TiN, TaN or a combination thereof. The barrier 40 may be a single layer or a multiple layer. After that, a first P-type work function layer 42 is formed to contact and conformally cover the barrier 40 in the second trench 20. A second P-type work function layer 44 is formed to contact and conformally cover the barrier 40 in the third trench 22. A third P-type work function layer 46 is formed to contact and conformally cover the barrier 40 in the fourth trench 24. It is noteworthy that there is not any P-type work function layer in the first trench 18. Furthermore, the thickness of the third P-type work function layer 46 is greater that the thickness of the first P-type work function layer 42. The thickness of the first P-type work function layer 42 is greater than the thickness of the second P-type work function layer 44. The materials of the first P-type work function layer 42, the second P-type work function layer 44 and the third P-type work function layer 46 can be independently selected from TiN, TaN, TiC, TaC, WC or TiAlN. The first P-type work function layer 42, the second P-type work function layer 44 and the third P-type work function layer 46 can respectively be a single layer or a multiple layer. According to a preferred embodiment of the present invention, the first P-type work function layer 42, the second P-type work function layer 44 and the third P-type work function layer 46 are made of the same material, but not limited to this circumstance. In other embodiments, the first P-type work function layer 42, the second P-type work function layer 44 and the third P-type work function layer 46 can be made of different materials. After the fabricating steps in FIG. 1 is completed, the gate dielectric layer 38, the barrier 40, the first P-type work function layer 42, the second P-type work function layer 44 and the third P-type work function layer 46 are all U-shaped under a cross-sectional view. Two ends of the gate dielectric layer 38, two ends of the barrier 40, two ends of the first P-type work function layer 42, two ends of the second P-type work function layer 44 and two ends of the third P-type work function layer 46 are all aligned with the top surface of the interlayer dielectric 16. Now, the first trench 18, the second trench 20, the third trench 22 and the fourth trench 24 are not filled up.

Figure 2:
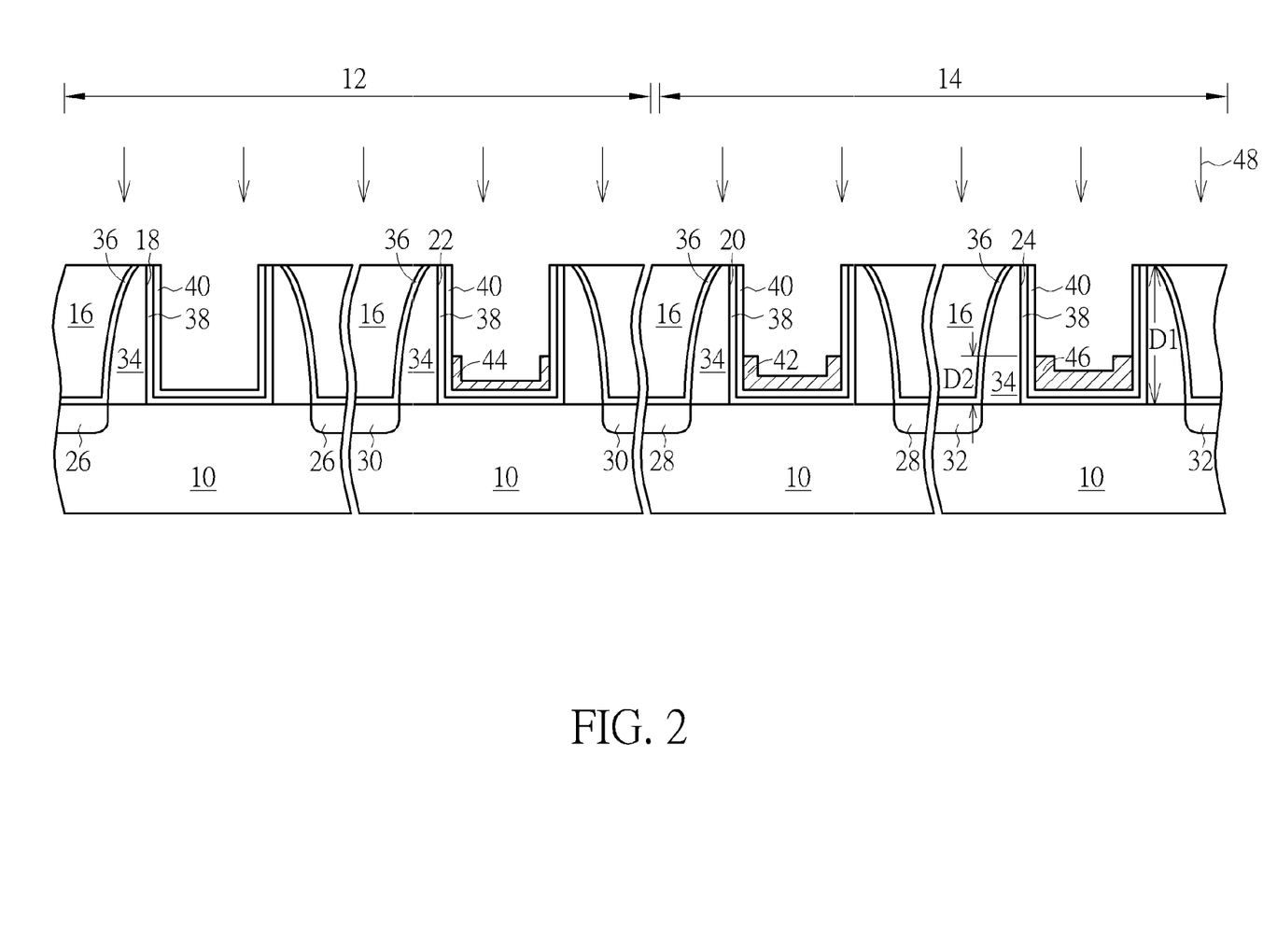
FIG. 2 is a fabricating stage following FIG. 1.

As shown in FIG. 2, a first removing process 48 is performed to remove the first P-type work function layer 42 at the upper part of the second trench 20, the second P-type work function layer 44 at the upper part of the third trench 22 and the third P-type work function layer 46 at the upper part of the fourth trench 24. When removing the first P-type work function layer 42, the second P-type work function layer 44 and the third P-type work function layer 46, the barrier 40 and the gate dielectric layer 38 are not removed. Furthermore, the second trench 20, the third trench 22 and the fourth trench 24 have the same depth D1. After the first removing process 48, two ends of the first P-type work function layer 42, two ends the second P-type work function layer 44 and two ends the third P-type work function layer 46 are respectively partly removed, and the two ends of the first P-type work function layer 42, two ends the second P-type work function layer 44 and two ends the third P-type work function layer 46 are distant from the top surface of the substrate 10 in a distance D2. According to a preferred embodiment of the present invention, the depth D1 is 5 to 25 times of the distance D2.

Figure 3:
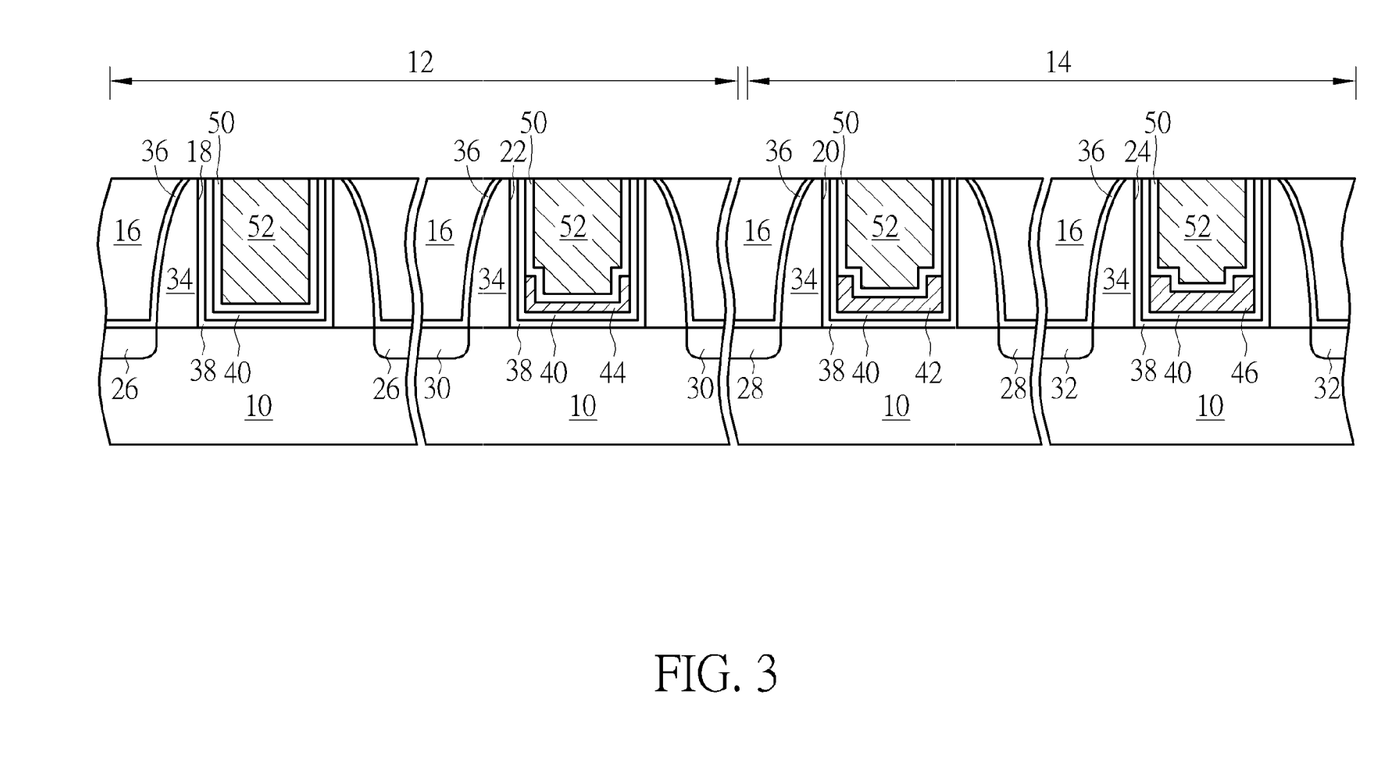
FIG. 3 is a fabricating stage following FIG. 2.

As shown in FIG. 3, an N-type work function layer 50 is formed to cover the barrier 40 in the first trench 18, the second P-type work function layer 44 and the barrier 40 in the third trench 22, the first P-type work function layer 42 and the barrier 40 in the second trench 20 and the third type work function layer 46 and the barrier 40 in the fourth trench 24. The N-type work function layer 50 may be TiAl, ZrAl, WAl, TaAl or HfAl. Because there is no P-type work function layer in the first trench 18, the N-type work function layer 50 in the first trench 18 is U-shaped under a cross-sectional view. The N-type work function layer 50 in the second trench 20, the third trench 22 and the fourth trench 24 respectively has two step-profiles because there are the first P-type work function layer 42, the second P-type work function layer 44 and the third type work function layer 46 remaining in the second trench 20, the third trench 22 and the fourth trench 24. Next, a metal layer 52 is formed to cover N-type work function layer in the first trench 18, the second trench 20, the third trench 22 and the fourth trench 24. After forming the metal layer 52, the first trench 18, the second trench 20, the third trench 22 and the fourth trench 24 are entirely filled up. The top surface of the metal layer 52 and two ends of the N-type work function layer 50 are aligned with the top surface of the interlayer dielectric 16. The metal layer 52 may be W, Al, Ti, Ta, Nb, Mo, Cu, TiN, TiC, TaN, Ti/W or Ti/TiN, but not limited to these metals.

Figure 4:
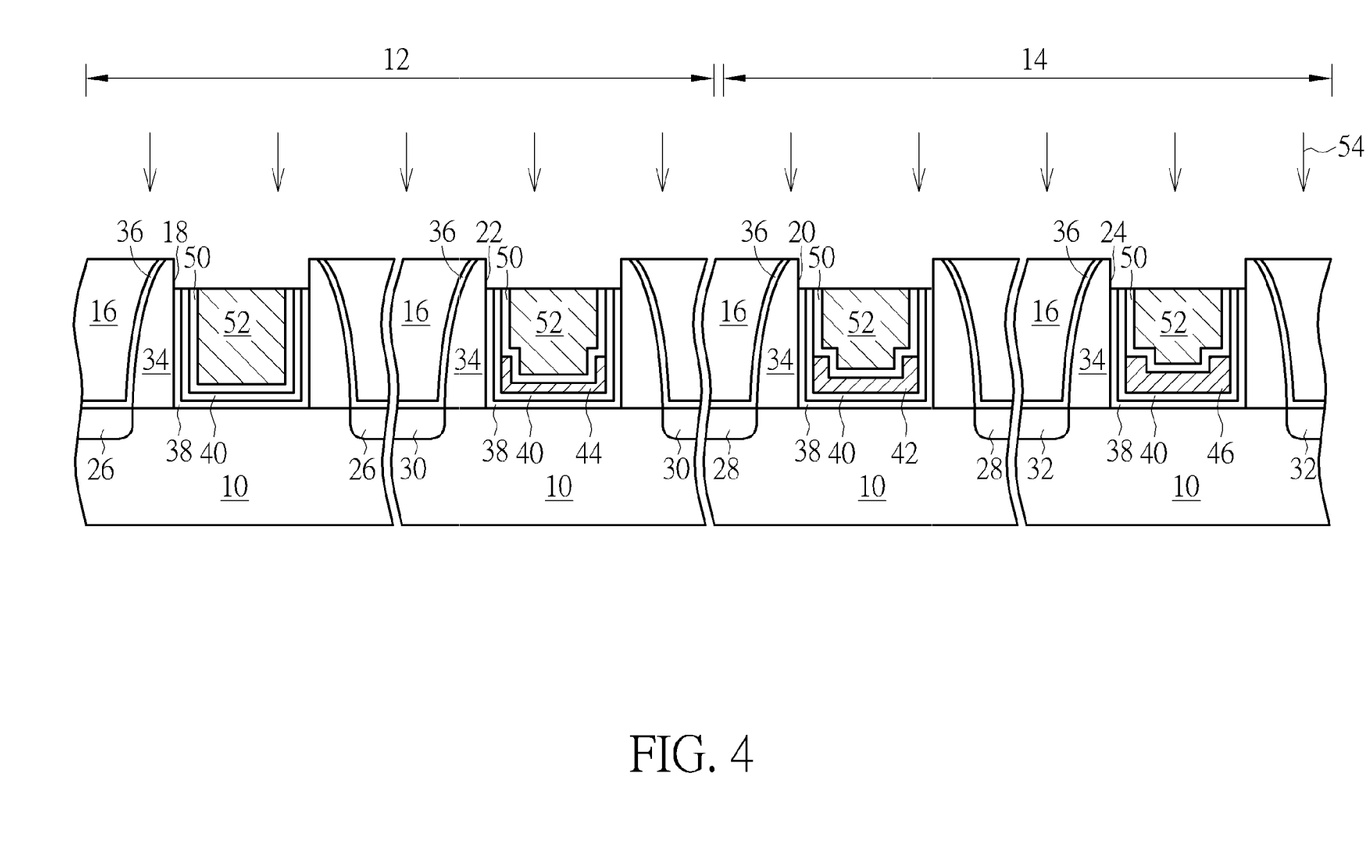
FIG. 4 is a fabricating stage following FIG. 3.

As shown in FIG. 4, a second removing process 54 is performed to simultaneously remove part of the gate dielectric layer 38, part of the barrier 40, part of the N-type work function layer 50 and part of the metal layer 52 in the first trench 18, the second trench 20, the third trench 22 and the fourth trench 24. The second removing process 54 is preferably a chemical mechanical planarization. In other embodiments, the second removing process 54 may be a wet etching or a dry etching. After the second removing process 54, the topmost surface of the gate dielectric layer 38, the topmost surface of the barrier 40, the topmost surface of the N-type work function layer 50 and the topmost surface of the metal layer 52 are all lower than the top surface of the interlayer dielectric 16 and are all coplanar.

Figure 5:
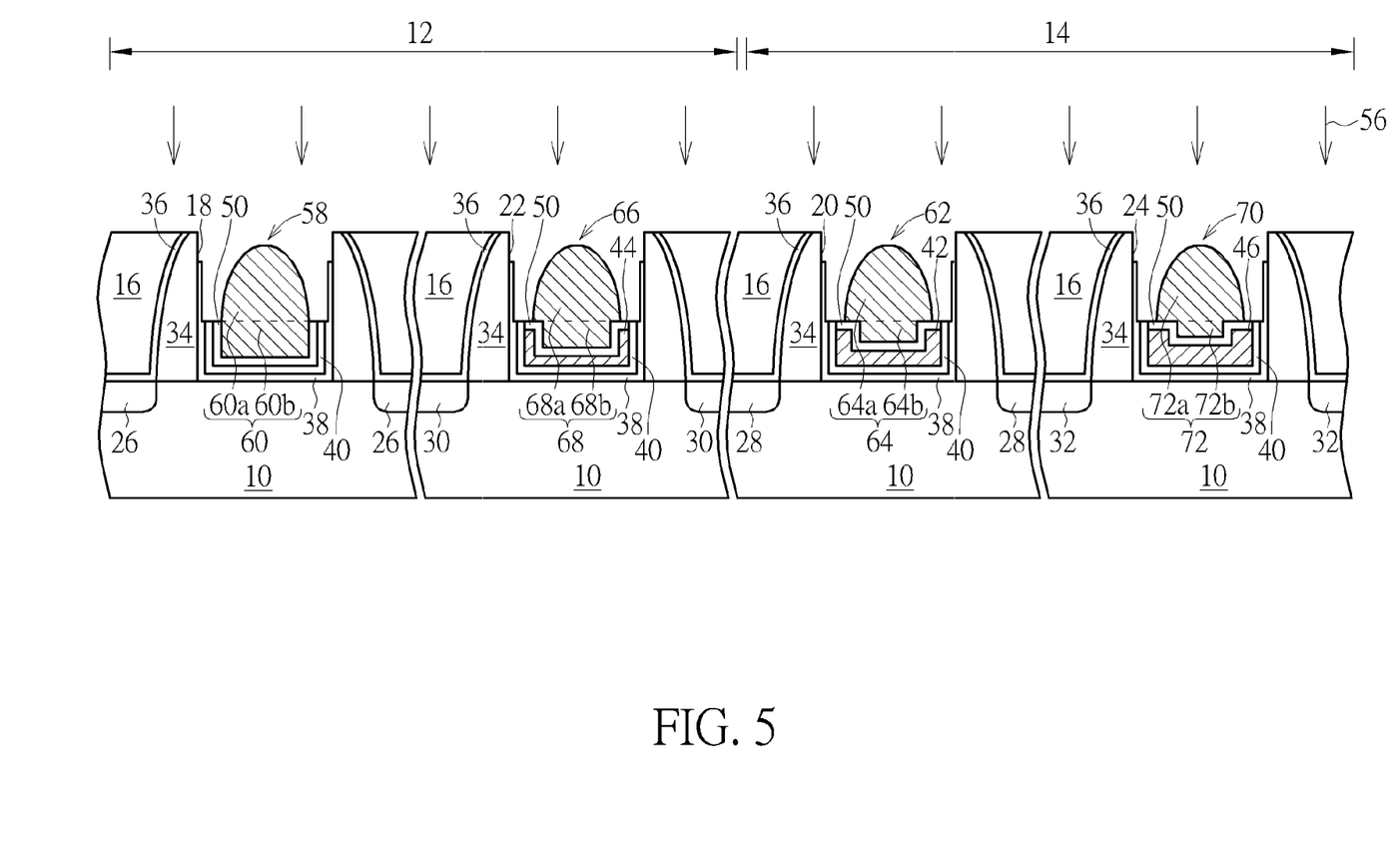
FIG. 5 is a fabricating stage following FIG. 4.

As shown in FIG. 5, a third removing process is performed to remove part of the N-type work function layer 50 in the first trench 18, in the second trench 20, in the third trench 22 and in the fourth trench 24 to make the metal layer 52 in the first trench 18, in the second trench 20, in the third trench 22 and in the fourth trench 24 protrude from the N-type work function layer 50. The third removing process 56 may be a wet etching. In detail, during the third removing process 56, the two ends of the N-type work function layer 50 in the first trench 18, in the second trench 20, in the third trench 22 and in the fourth trench 24 are shortened, and two ends of the barrier 40 and two ends of the gate dielectric layer 38 are shortened as well. The gate dielectric layer 38 is shortened less than the N-type work function layer 50. Furthermore, after the two ends of the N-type work function layer 50 is shortened, the first P-type work function layer 42, the second P-type work function layer 44 and the third P-type work function layer 46 may be exposed or not. FIG. 5 takes the first P-type work function layer 42, the second P-type work function layer 44 and the third P-type work function layer 46 not exposed as an example. During the third removing process 56, part of the metal layer 52 is removed to round the surface of the metal layer 52. Therefore, after the third removing process 56, the metal layer 52 in the first trench 18 forms a first gate electrode 58. The first gate electrode 58 has a bullet-shaped profile 60 under a cross-sectional view. The metal layer 52 in the second trench 20 forms a second gate electrode 62. The second gate electrode 62 has a first mushroom-shaped profile 64 under a cross-sectional view. The metal layer 52 in the third trench 22 forms a third gate electrode 66. The third gate electrode 66 has a second mushroom-shaped profile 68 under a cross-sectional view. The metal layer 52 in the fourth trench 24 forms a fourth gate electrode 70. The fourth gate electrode 70 has a third mushroom-shaped profile 72 under a cross-sectional view.

Because there is no P-type work function layer in the first trench 18, the lower portion of the first gate electrode 58 does not shrink inwardly. On the other hand, the lower portion of the second gate electrode 62, the gate electrode 66 and the third gate electrode 70 shrink inwardly because of the P-type work function layer exist. For example, the bullet-shaped profile 60 is formed by a first arch 60a and a first rectangle 60b. The interface between the first arch 60a and the first rectangle 60b is marked by dotted line in FIG. 5. A bottom of the first arch 60a contacts a long side of the first rectangle 60b, a length of the bottom of the first arch 60a equals a length of the long side of the first rectangle 60b. The first mushroom-shaped profile 64 includes a second arch 64a and a second rectangle 64b. The interface between the second arch 64a and the second rectangle 64b is marked by dotted line in FIG. 5. A bottom of the second arch 64a contacts a long side of the second rectangle 64b, a length of the bottom of the second arch 64a is greater than a length of the long side of the second rectangle 64b. Moreover, because the first P-type work function layer 42, the second P-type work function layer 44 and the third P-type work function layer 46 have different thicknesses, the detailed contours of the first mushroom-shaped profile 64, the second mushroom-shaped profile 68, and the third mushroom-shaped profile 72 are also different. For example, the second mushroom-shaped profile 68 includes a third arch 68a and a third rectangle 68b. The interface between the third arch 68a and the third rectangle 68b is marked by dotted line in FIG. 5. A bottom of the third arch 68a contacts a long side of the third rectangle 68b, and a length of the long side of the third rectangle 68a is greater than the length of the long side of the second rectangle 64b. The third mushroom-shaped profile 72 includes a fourth arch 72a and a fourth rectangle 72b. The interface between the fourth arch 72a and the fourth rectangle 72b is marked by dotted line in FIG. 5. A bottom of the fourth arch 72a contacts a long side of the fourth rectangle 72b, and the length of the long side of the second rectangle 64b is greater than the length of the long side of the fourth rectangle 72b. A length of a short side of the third rectangle 68b is longer than a length of a short side of the second rectangle 64b. A length of the short side of the second rectangle 64b is longer than a length of a short side of the fourth rectangle 72b.

Figure 6:
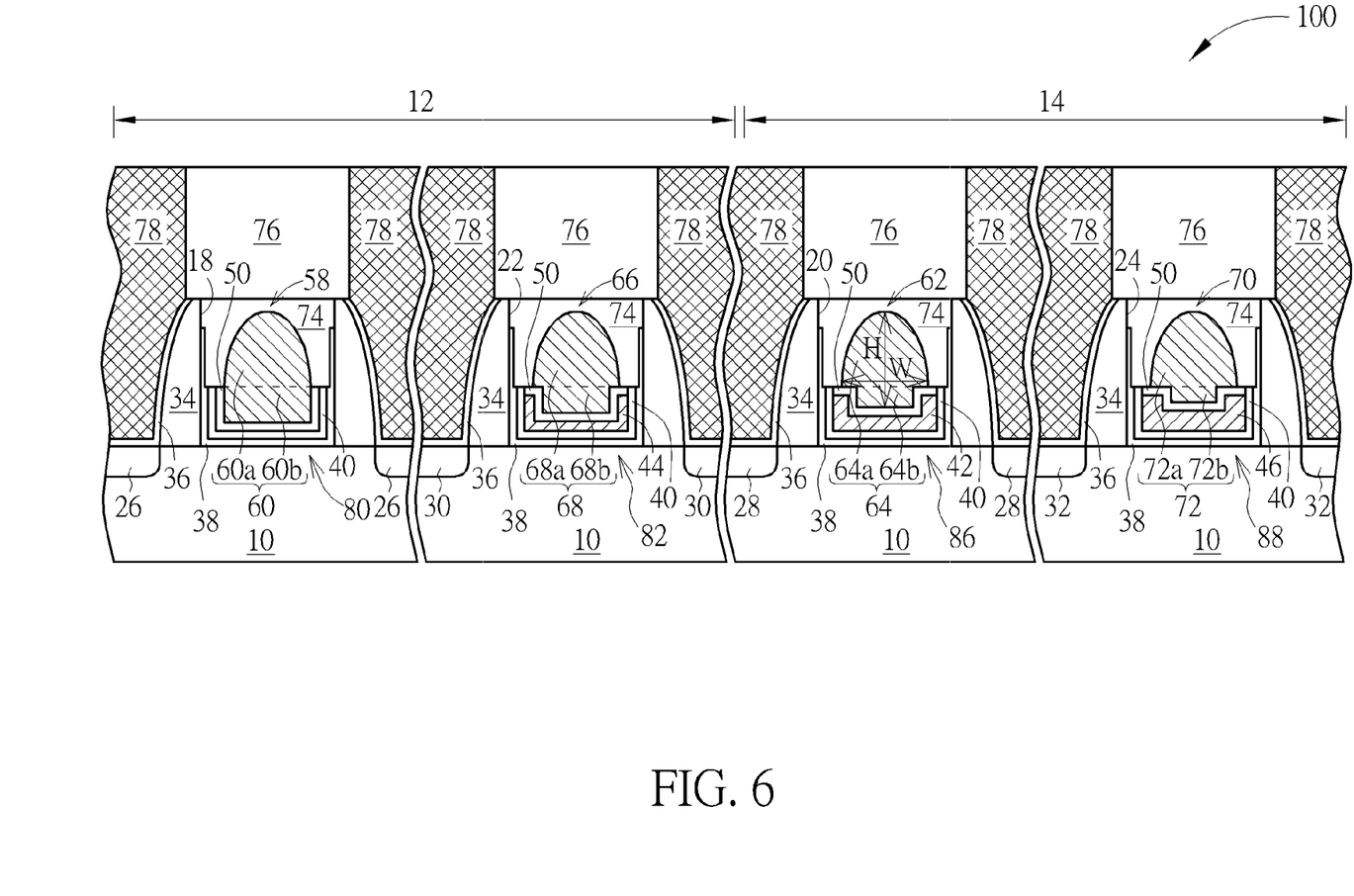
FIG. 6 is a fabricating stage following FIG. 5.

As shown in FIG. 6, a cap layer 74 is formed to fill in the first trench 18, the second trench 20, the third trench 22 and fourth trench 24. Now, a gate structure of the present invention 100 is completed. Later, an interlayer dielectric 76 is formed to cover the interlayer dielectric 16. Then, a self-aligned contact process is performed to form contact plugs 78 contacting each of the source/drain doped regions 26/28/30/32.

Figure 7:
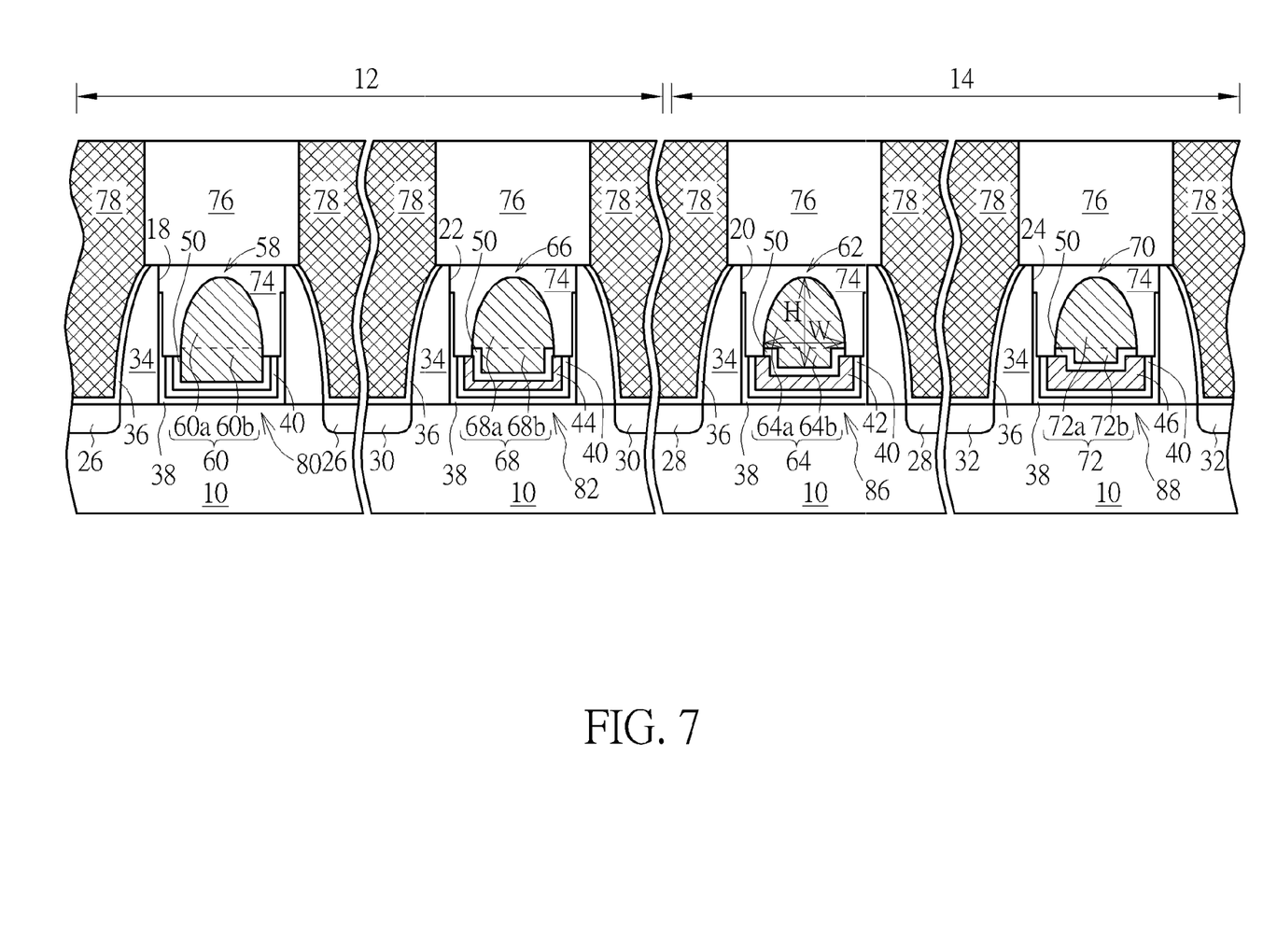
FIG. 7 depicts a fabricating method of a gate structure according to another preferred embodiment of the present invention.

As shown in FIG. 7, according to another preferred embodiment of the present invention, during the third removing process 56, two ends of the N-type work function layer 50 can be shortened to expose the first P-type work function layer 42, the second P-type work function layer 44 and the third P-type work function layer 46. After that, a cap layer 74 is formed. Later, an interlayer dielectric 76 and contact plugs are formed.

FIG. 6 depicts a gate structure according to a preferred embodiment of the present invention. As shown in FIG. 6, a gate structure 100 includes a substrate 10. The substrate 10 is divided into an N-type transistor region 12 and a P-type transistor region 14. An interlayer dielectric 16 covers the substrate 10. A first N-type gate structure 80 and a second N-type gate structure 82 are disposed within the N-type transistor region 12. A first P-type gate structure 86 and a second P-type gate structure 88 are disposed in the P-type transistor region 14. The first N-type gate structure 80 includes a first trench 18 embedded in the interlayer dielectric 16. A first gate electrode 58 is disposed in the first trench 18. The first gate electrode 58 has a bullet-shaped profile 60 under a cross-sectional view. A gate dielectric layer 38 contacts the first trench 18. An N-type work function layer 50 is disposed between the gate dielectric layer 38 and the first gate electrode 58. A barrier layer 40 is disposed between the N-type work function layer 50 and the gate dielectric layer 38. A cap layer 74 covers the first gate electrode 58. The first P-type gate structure 86 includes a second trench 20 embedded in the interlayer dielectric 16. A second gate electrode 62 is disposed in the second trench 20. The second gate electrode 62 has a first mushroom-shaped profile 64 under a cross-sectional view. The gate dielectric layer 38 contacts the second trench 20. The N-type work function layer 50 is disposed between the gate dielectric layer 38 and the second gate electrode 62. A first P-type work function layer 42 is disposed between the gate dielectric layer 38 and the N-type work function layer 50. The barrier layer 40 is disposed between the first P-type work function layer 42 and the gate dielectric layer 38. The cap layer 74 covers the second gate electrode 62.

The second N-type gate structure 82 includes a third trench 22 embedded in the interlayer dielectric 16. A third gate electrode 66 is disposed in the third trench 22. The third gate electrode 66 has a second mushroom-shaped profile 68 under a cross-sectional view. The gate dielectric layer 38 contacts the third trench 22. The N-type work function layer 50 is disposed between the gate dielectric layer 38 and the third gate electrode 66. A second P-type work function layer 44 is disposed between the gate dielectric layer 38 and the N-type work function layer 50. The barrier layer 40 is disposed between the second P-type work function layer 44 and the gate dielectric layer 38. The cap layer 74 covers the third gate electrode 66. The second P-type gate structure 88 includes a fourth trench 24 embedded in the interlayer dielectric 16. A fourth gate electrode 70 is disposed in the fourth trench 24. The fourth gate electrode 70 has a third mushroom-shaped profile 72 under a cross-sectional view. The gate dielectric layer 38 contacts the fourth trench 24. The N-type work function layer 50 is disposed between the gate dielectric layer 38 and the fourth gate electrode 70. A third P-type work function layer 46 is disposed between the gate dielectric layer 38 and the N-type work function layer 50. The barrier layer 40 is disposed between the third P-type work function layer 46 and the gate dielectric layer 38. The cap layer 74 covers the fourth gate electrode 70.

It is noteworthy that the thickness of the third P-type work function layer 46 is greater that the thickness of the first P-type work function layer 42. The thickness of the first P-type work function layer 42 is greater than the thickness of the second P-type work function layer 44. Moreover, there is no P-type work function layer within the first N-type gate structure 80. The first P-type work function layer 42, the second P-type work function layer 44 and the third P-type work function layer 46 are made of the same material, but not limited to this circumstance. The first P-type work function layer 42 and the N-type work function layer 50 are made of different materials. Furthermore, the first mushroom-shaped profile 64 has a height H and a width W. The height H is 1.48 to 3.12 times of the width W. Similarly, the height respectively of the second mushroom-shaped profile 68 and the third mushroom-shaped profile 72 is 1.48 to 3.12 times of the width respectively of the second mushroom-shaped profile 68 and the third mushroom-shaped profile 72.

The present invention removes a lot of the upper portion of the P-type work function layer during the first removing process, the remaining P-type work function layer only covers a small part of the trench. This process makes the metal gate have more room and have more surface area. The sheet resistance of the metal gate can thus be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A gate structure, comprising:
a substrate divided into an N-type transistor region and a P-type transistor region;
an interlayer dielectric covering the substrate;
a first N-type gate structure disposed within the N-type transistor region, wherein the first N-type gate structure comprises:
a first trench embedded in the interlayer dielectric;
a first gate electrode disposed in the first trench, wherein the first gate electrode has a bullet-shaped profile under a cross-sectional view;
a gate dielectric layer contacting the first trench, wherein the gate dielectric layer is U-shaped and the gate dielectric layer has two ends which are lower than a top surface of the interlayer dielectric;
an N-type work function layer disposed between the gate dielectric layer and the first gate electrode, wherein the N-type work function layer does not contact the gate dielectric layer, and the N-type work function layer contacts the first gate electrode;
a barrier disposed between and contacting the N-type work function layer and the gate dielectric layer, wherein the barrier layer and the N-type work function layer are sandwiched between the first gate electrode and the gate dielectric layer;
a first P-type gate structure disposed within the P-type transistor region, wherein the first P-type gate structure comprises:
a second trench embedded in the interlayer dielectric;
a second gate electrode disposed in the second trench, wherein the second gate electrode has a first mushroom-shaped profile under a cross-sectional view;
the gate dielectric layer contacting the second trench;
the N-type work function layer disposed between the gate dielectric layer and the second gate electrode;
a first P-type work function layer disposed between the gate dielectric layer and the N-type work function layer; and
the barrier disposed between and contacting the gate dielectric layer and the first P-type work function layer, wherein the N-type work function layer, the first P-type work function layer and the barrier are sandwiched between the second gate electrode and the gate dielectric layer.

2. The gate structure of claim 1, further comprising:
a second N-type gate structure disposed within the N-type transistor region, wherein the second N-type gate structure comprises:
a third trench embedded in the interlayer dielectric;
a third gate electrode disposed in the third trench, wherein the third gate electrode has a second mushroom-shaped profile under a cross-sectional view;
the gate dielectric layer contacting the third trench;
the N-type work function layer disposed between the gate dielectric layer and the third gate electrode;
a second P-type work function layer disposed between the gate dielectric layer and the N-type work function layer;
a second P-type gate structure disposed within the P-type transistor region, wherein the second P-type gate structure comprises:
a fourth trench embedded in the interlayer dielectric;
a fourth gate electrode disposed in the fourth trench, wherein the fourth gate electrode has a third mushroom-shaped profile under a cross-sectional view;
the gate dielectric layer contacting the fourth trench;
the N-type work function layer disposed between the gate dielectric layer and the fourth gate electrode; and
a third P-type work function layer disposed between the gate dielectric layer and the N-type work function layer, wherein a thickness of the third P-type work function layer is greater than a thickness of the first P-type work function layer, and the thickness of the first P-type work function layer is greater than a thickness of the second P-type work function layer.

3. The gate structure of claim 2, wherein the first mushroom-shaped profile includes a second arch and a second rectangle, a bottom of the second arch contacts a long side of the second rectangle, the second mushroom-shaped profile includes a third arch and a third rectangle, a bottom of the third arch contacts a long side of the third rectangle, and a length of the long side of the third rectangle is greater than a length of the long side of the second rectangle.

4. The gate structure of claim 2, wherein the first P-type work function layer, the second P-type work function layer and the third P-type work function layer are the same material, and the first P-type work function layer and the N-type work function layer are different materials.

5. The gate structure of claim 1, wherein the bullet-shaped profile includes a first arch and a first rectangle, a bottom of the first arch contacts a long side of the first rectangle, and a length of the bottom of the first arch equals a length of the long side of the first rectangle.

6. The gate structure of claim 1, wherein the first mushroom-shaped profile includes a second arch and a second rectangle, a bottom of the second arch contacts a long side of the second rectangle, and a length of the bottom of the second arch is greater than a length of the long side of the second rectangle.

7. The gate structure of claim 6, wherein the first mushroom-shaped profile consists of the second arch and the second rectangle.

8. The gate structure of claim 1, wherein there is no P-type work function layer within the first N-type gate structure.

9. The gate structure of claim 1, wherein the gate dielectric layer has two different thicknesses.

10. A gate structure, comprising:
a substrate divided into an N-type transistor region and a P-type transistor region;
an interlayer dielectric covering the substrate;
a first N-type gate structure disposed within the N-type transistor region, wherein the first N-type gate structure comprises:
a first trench embedded in the interlayer dielectric;
a first gate electrode disposed in the first trench, wherein the first gate electrode has a bullet-shaped profile under a cross-sectional view;
a gate dielectric layer contacting the first trench, wherein the gate dielectric layer is U-shaped, the gate dielectric layer has a first bottom and two sidewalls connecting to the first bottom, the two sidewalls are perpendicular to a top surface of the substrate, each of the two sidewalls has two different thicknesses, each of the two sidewalls has a step profile, and the gate dielectric layer has two ends which are lower than a top surface of the interlayer dielectric;
an N-type work function layer disposed between the gate dielectric layer and the first gate electrode, and the N-type work function layer contacting the first gate electrode;
a first P-type gate structure disposed within the P-type transistor region, wherein the first P-type gate structure comprises:
a second trench embedded in the interlayer dielectric;
a second gate electrode disposed in the second trench, wherein the second gate electrode has a first mushroom-shaped profile under a cross-sectional view;
the gate dielectric layer contacting the second trench;
the N-type work function layer disposed between the gate dielectric layer and the second gate electrode; and
a first P-type work function layer disposed between the gate dielectric layer and the N-type work function layer.

11. The gate structure of claim 10, further comprising:
a second N-type gate structure disposed within the N-type transistor region, wherein the second N-type gate structure comprises:
a third trench embedded in the interlayer dielectric;
a third gate electrode disposed in the third trench, wherein the third gate electrode has a second mushroom-shaped profile under a cross-sectional view;
the gate dielectric layer contacting the third trench;
the N-type work function layer disposed between the gate dielectric layer and the third gate electrode;
a second P-type work function layer disposed between the gate dielectric layer and the N-type work function layer;
a second P-type gate structure disposed within the P-type transistor region, wherein the second P-type gate structure comprises:
a fourth trench embedded in the interlayer dielectric;
a fourth gate electrode disposed in the fourth trench, wherein the fourth gate electrode has a third mushroom-shaped profile under a cross-sectional view;
the gate dielectric layer contacting the fourth trench;
the N-type work function layer disposed between the gate dielectric layer and the fourth gate electrode; and
a third P-type work function layer disposed between the gate dielectric layer and the N-type work function layer, wherein a thickness of the third P-type work function layer is greater than a thickness of the first P-type work function layer, and the thickness of the first P-type work function layer is greater than a thickness of the second P-type work function layer.

12. The gate structure of claim 11, wherein the first mushroom-shaped profile includes a second arch and a second rectangle, a bottom of the second arch contacts a long side of the second rectangle, the second mushroom-shaped profile includes a third arch and a third rectangle, a bottom of the third arch contacts a long side of the third rectangle, and a length of the long side of the third rectangle is greater than a length of the long side of the second rectangle.

13. The gate structure of claim 11, wherein the first P-type work function layer, the second P-type work function layer and the third P-type work function layer are the same material, and the first P-type work function layer and the N-type work function layer are different materials.

14. The gate structure of claim 10, wherein the bullet-shaped profile includes a first arch and a first rectangle, a bottom of the first arch contacts a long side of the first rectangle, and a length of the bottom of the first arch equals a length of the long side of the first rectangle.

15. The gate structure of claim 10, wherein the first mushroom-shaped profile includes a second arch and a second rectangle, a bottom of the second arch contacts a long side of the second rectangle, and a length of the bottom of the second arch is greater than a length of the long side of the second rectangle.

16. The gate structure of claim 15, wherein the first mushroom-shaped profile consists of the second arch and the second rectangle.

17. The gate structure of claim 10, wherein there is no P-type work function layer within the first N-type gate structure.

* * * * *